United States Patent
Luere et al.

(10) Patent No.: US 10,553,404 B2
(45) Date of Patent: Feb. 4, 2020

(54) ADJUSTABLE EXTENDED ELECTRODE FOR EDGE UNIFORMITY CONTROL

(71) Applicant: Applied Materials, Inc., Santa Clara, CA (US)

(72) Inventors: Olivier Luere, Sunnyvale, CA (US); Leonid Dorf, San Jose, CA (US); Sunil Srinivasan, Milpitas, CA (US); Rajinder Dhindsa, Pleasanton, CA (US); James Rogers, Los Gatos, CA (US); Denis M. Koosau, Pleasanton, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 200 days.

(21) Appl. No.: 15/421,726

(22) Filed: Feb. 1, 2017

(65) Prior Publication Data

US 2018/0218933 A1    Aug. 2, 2018

(51) Int. Cl.
*H01J 37/32* (2006.01)
*H01L 21/687* (2006.01)
*H01L 21/683* (2006.01)

(52) U.S. Cl.
CPC .. *H01J 37/32431* (2013.01); *H01J 37/32009* (2013.01); *H01L 21/6831* (2013.01);
(Continued)

(58) Field of Classification Search
CPC ........... H01J 37/32642; H01J 37/32082; H01J 37/32449; H01J 37/32513
See application file for complete search history.

(56) References Cited

U.S. PATENT DOCUMENTS

| 5,267,607 A | 12/1993 | Wada |
| 5,660,673 A | 8/1997 | Miyoshi |

(Continued)

FOREIGN PATENT DOCUMENTS

| CN | 105336561 A | 2/2016 |
| CN | 105789010 A | 7/2016 |

OTHER PUBLICATIONS

"Bracelet Holder Vise Clamp Stone Prong Pave Channel Setting Setter." Prolinemax, www.prolinemax.com/BRACELET-HOLDER-VISE-Clamp-Stone-Prong-Pave-Channel-Setting-Setter-_p_1006.html.
(Continued)

*Primary Examiner* — Robert M Kunemund
(74) *Attorney, Agent, or Firm* — Patterson & Sheridan, LLP (57) ABSTRACT

Embodiments described herein generally related to a substrate processing apparatus. In one embodiment, a process kit for a substrate processing chamber disclosed herein. The process kit includes a ring having a first ring component and a second ring component, an adjustable tuning ring, and an actuating mechanism. The first ring component is interfaced with the second ring component such that the second ring component is movable relative to the first ring component forming a gap therebetween. The adjustable tuning ring is positioned beneath the ring and contacts a bottom surface of the second ring component. A top surface of the adjustable tuning ring contacts the second ring component. The actuating mechanism is interfaced with the bottom surface of the adjustable tuning ring. The actuating mechanism is configured to actuate the adjustable tuning ring such that the gap between the first ring component and the second ring component varies.

20 Claims, 6 Drawing Sheets

(52) U.S. Cl.
CPC .. *H01L 21/68735* (2013.01); *H01L 21/68742* (2013.01); *H01J 2237/334* (2013.01)

(56) References Cited

U.S. PATENT DOCUMENTS

| | | |
|---|---|---|
| 5,730,801 A | 3/1998 | Tepman et al. |
| 5,762,714 A | 6/1998 | Mohn et al. |
| 5,851,140 A | 12/1998 | Barns et al. |
| 6,022,809 A | 2/2000 | Fan |
| 6,044,534 A | 4/2000 | Seo et al. |
| 6,206,976 B1 | 3/2001 | Crevasse et al. |
| 6,391,787 B1 | 5/2002 | Dhindsa et al. |
| 6,511,543 B1 | 1/2003 | Stauss et al. |
| 6,589,352 B1 | 7/2003 | Yudovsky et al. |
| 6,709,547 B1 | 3/2004 | Ni et al. |
| 6,744,212 B2 | 6/2004 | Fischer et al. |
| 6,896,765 B2 | 5/2005 | Steger |
| 6,898,558 B2 | 5/2005 | Klekotka |
| 7,138,014 B2 | 11/2006 | Stevens et al. |
| 7,138,067 B2 | 11/2006 | Vahedi et al. |
| 7,176,403 B2 | 2/2007 | Steger |
| 7,252,738 B2 | 8/2007 | Tong et al. |
| 7,311,784 B2 | 12/2007 | Fink |
| 7,589,950 B2 | 9/2009 | Parkhe et al. |
| 7,824,146 B2 | 11/2010 | Lanee et al. |
| 7,968,469 B2 | 6/2011 | Collins et al. |
| 8,270,141 B2 | 9/2012 | Willwerth et al. |
| 8,298,371 B2 | 10/2012 | Koshimizu et al. |
| 8,441,640 B2 | 5/2013 | Patalay et al. |
| 8,696,878 B2 | 4/2014 | Riker et al. |
| 8,900,398 B2 | 12/2014 | Dhindsa et al. |
| 8,933,628 B2 | 1/2015 | Banna et al. |
| 8,988,848 B2 | 3/2015 | Todorow et al. |
| 8,999,106 B2 | 4/2015 | Liu et al. |
| 9,011,637 B2 | 4/2015 | Yamamoto |
| 9,017,526 B2 | 4/2015 | Singh et al. |
| 9,076,636 B2 | 7/2015 | Ohata et al. |
| 9,142,391 B2 | 9/2015 | Yamamoto |
| 9,287,093 B2 | 3/2016 | Singh et al. |
| 9,410,249 B2 | 8/2016 | Male et al. |
| 9,583,357 B1 | 2/2017 | Long et al. |
| 9,601,319 B1 | 3/2017 | Bravo et al. |
| 9,620,376 B2 | 4/2017 | Kamp et al. |
| 9,761,459 B2 | 9/2017 | Long et al. |
| 9,852,889 B1 | 12/2017 | Kellogg et al. |
| 9,881,820 B2 | 1/2018 | Wong et al. |
| 9,947,517 B1 * | 4/2018 | Luere ................ H01J 37/32642 |
| 10,103,010 B2 | 10/2018 | Luere et al. |
| 2003/0173031 A1 | 9/2003 | Aggarwal et al. |
| 2003/0201069 A1 | 10/2003 | Johnson |
| 2004/0053428 A1 | 3/2004 | Steger |
| 2004/0149389 A1 | 8/2004 | Fink |
| 2005/0133164 A1 | 6/2005 | Fischer et al. |
| 2005/0263070 A1 | 12/2005 | Fink |
| 2008/0236749 A1 | 10/2008 | Koshimizu et al. |
| 2008/0289766 A1 | 11/2008 | Heemstra et al. |
| 2009/0041568 A1 | 2/2009 | Muraoka et al. |
| 2009/0067954 A1 | 3/2009 | Lanee et al. |
| 2010/0206484 A1 | 8/2010 | Hiromi et al. |
| 2011/0157760 A1 | 6/2011 | Willwerth et al. |
| 2011/0287631 A1 | 11/2011 | Yamamoto |
| 2012/0091108 A1 | 4/2012 | Lin et al. |
| 2012/0256363 A1 | 10/2012 | Okita et al. |
| 2012/0305184 A1 | 12/2012 | Singh et al. |
| 2013/0106286 A1 | 5/2013 | Banna et al. |
| 2013/0155568 A1 | 6/2013 | Todorow et al. |
| 2014/0017900 A1 | 1/2014 | Doba et al. |
| 2014/0213055 A1 | 7/2014 | Himori et al. |
| 2014/0265089 A1 | 9/2014 | Tantiwong et al. |
| 2015/0064809 A1 | 3/2015 | Lubomirsky |
| 2015/0181684 A1 | 6/2015 | Banna et al. |
| 2015/0200124 A1 | 7/2015 | Yamamoto |
| 2015/0332951 A1 | 11/2015 | Male et al. |
| 2016/0211165 A1 | 7/2016 | McChesney et al. |
| 2016/0211166 A1 | 7/2016 | Yan et al. |
| 2016/0240415 A1 | 8/2016 | Sekiya |
| 2017/0018411 A1 | 1/2017 | Sriraman et al. |
| 2017/0069462 A1 | 3/2017 | Kanarik et al. |
| 2017/0110335 A1 | 4/2017 | Yang et al. |
| 2017/0113355 A1 | 4/2017 | Genetti et al. |
| 2017/0115657 A1 | 4/2017 | Trussell et al. |
| 2017/0117170 A1 | 4/2017 | Wong et al. |
| 2017/0117172 A1 | 4/2017 | Genetti et al. |
| 2017/0133283 A1 | 5/2017 | Kenworthy |
| 2017/0178917 A1 | 6/2017 | Kamp et al. |
| 2017/0213758 A1 | 7/2017 | Rice et al. |
| 2017/0236688 A1 | 8/2017 | Caron et al. |
| 2017/0236741 A1 | 8/2017 | Angelov et al. |
| 2017/0236743 A1 | 8/2017 | Severson et al. |
| 2017/0250056 A1 | 8/2017 | Boswell et al. |
| 2017/0263478 A1 | 9/2017 | McChesney et al. |
| 2017/0278679 A1 | 9/2017 | Angelov et al. |
| 2017/0287682 A1 | 10/2017 | Musselman et al. |
| 2017/0287753 A1 | 10/2017 | Musselman et al. |
| 2017/0316935 A1 | 11/2017 | Tan et al. |
| 2017/0330786 A1 | 11/2017 | Genetti et al. |
| 2017/0334074 A1 | 11/2017 | Genetti et al. |
| 2017/0372912 A1 | 12/2017 | Long et al. |
| 2018/0019107 A1 | 1/2018 | Ishizawa |
| 2018/0061696 A1 | 3/2018 | D'Ambra et al. |
| 2018/0090354 A1 | 3/2018 | Sugita et al. |
| 2018/0166259 A1 | 6/2018 | Ueda |
| 2018/0218933 A1 | 8/2018 | Luere et al. |
| 2018/0233328 A1 | 8/2018 | Ueda et al. |
| 2018/0277416 A1 | 9/2018 | Takahashi et al. |
| 2018/0301322 A1 | 10/2018 | Sugita et al. |
| 2018/0315583 A1 | 11/2018 | Luere et al. |
| 2018/0315640 A1 | 11/2018 | Ueda et al. |
| 2019/0172714 A1 | 6/2019 | Bobek et al. |

OTHER PUBLICATIONS

International Search Report and Written Opinion dated Apr. 24, 2017 for Application No. PCT/US2016/069449.
Notice of Allowance and Fees Due dated Oct. 6, 2017 for U.S. Appl. No. 15/382,004.
Notice of Allowance and Fees Due dated Oct. 25, 2017 for U.S. Appl. No. 15/382,004.
Notice of Allowance and Fees Due dated Feb. 21, 2018 for U.S. Appl. No. 15/382,004.
Notice of Allowance and Fees Due dated Jun. 27, 2018 for U.S. Appl. No. 15/951,540.
Non-Final Office Action dated Feb. 4, 2019 for U.S. Appl. No. 16/026,853.
Notice of Allowance and Fees Due dated Aug. 19, 2019 for U.S. Appl. No. 16/026,853.
Notice of Allowance and Fees Due/ Examiner Initiated Interview Summary dated Sep. 23, 2019 for U.S. Appl. No. 16/026,853.

* cited by examiner

ADJUSTABLE EXTENDED ELECTRODE FOR EDGE UNIFORMITY CONTROL

BACKGROUND

Field

Embodiments described herein generally relate to a substrate processing apparatus, and more specifically to an improved process kit for a substrate processing apparatus.

Description of the Related Art

As semiconductor technology nodes advanced with reduced size device geometries, substrate edge critical dimension uniformity requirements become more stringent and affect die yields. Commercial plasma reactors include multiple tunable knobs for controlling process uniformity across a substrate, such as, for example, temperature, gas flow, RF power, and the like. Typically, in etch processes, silicon substrates are etched while electrostatically clamped to an electrostatic chuck.

During processing, a substrate resting on a substrate support may undergo a process that deposits material on the substrate and to remove, or etch, portions of the material from the substrate, often in succession or in alternating processes. It is typically beneficial to have uniform deposition and etching rates across the surface of the substrate. However, process non-uniformities often exist across the surface of the substrate and may be significant at the perimeter or edge of the substrate. These non-uniformities at the perimeter may be attributable to electric field termination affects and are sometimes referred to as edge effects. During deposition or etching, a process kit containing at least a deposition ring is sometimes provided to favorably influence uniformity at the substrate perimeter or edge.

Accordingly, there is a continual need for an improved process kit for a substrate processing apparatus.

SUMMARY

Embodiments described herein generally related to a substrate processing apparatus. In one embodiment, a process kit for a substrate processing chamber disclosed herein. The process kit includes a ring, an adjustable tuning ring, and an actuating mechanism. The ring has a first ring component and a second ring component. The first ring component is interfaced with the second ring component such that the second ring component is movable relative to the first ring component forming a gap therebetween. The adjustable tuning ring is positioned beneath the ring and contacts a bottom surface of the second ring component. The adjustable tuning ring has a top surface and a bottom surface. The top surface of the adjustable tuning ring contacts the second ring component. The actuating mechanism is interfaced with the bottom surface of the adjustable tuning ring. The actuating mechanism is configured to actuate the adjustable tuning ring such that the gap between the first ring component and the second ring component varies.

In another embodiment, a processing chamber is disclosed herein. The processing chamber includes a substrate support member and a process kit. The substrate support member is configured to support a substrate. The process kit is supported by the substrate support member. The process kit includes a ring, an adjustable tuning ring, and an actuating mechanism. The ring has a first ring component and a second ring component. The first ring component is interfaced with the second ring component such that the second ring component is movable relative to the first ring component forming a gap therebetween. The adjustable tuning ring is positioned beneath the ring and contacts a bottom surface of the second ring component. The adjustable tuning ring has a top surface and a bottom surface. The top surface of the adjustable tuning ring contacts the second ring component. The actuating mechanism is interfaced with the bottom surface of the adjustable tuning ring. The actuating mechanism is configured to actuate the adjustable tuning ring such that the gap between the first ring component and the second ring component varies.

In another embodiment, a method of processing a substrate is disclosed herein. The substrate is positioned on a substrate support member disposed in a substrate processing chamber. A plasma is created above a substrate. A height of a component of an edge ring is adjusted by actuating an adjustable tuning ring interfaced with the component to change a direction of ions at an edge of the substrate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

For clarity, identical reference numerals have been used, where applicable, to designate identical elements that are common between figures. Additionally, elements of one embodiment may be advantageously adapted for utilization in other embodiments described herein.

DETAILED DESCRIPTION

Figure 1:
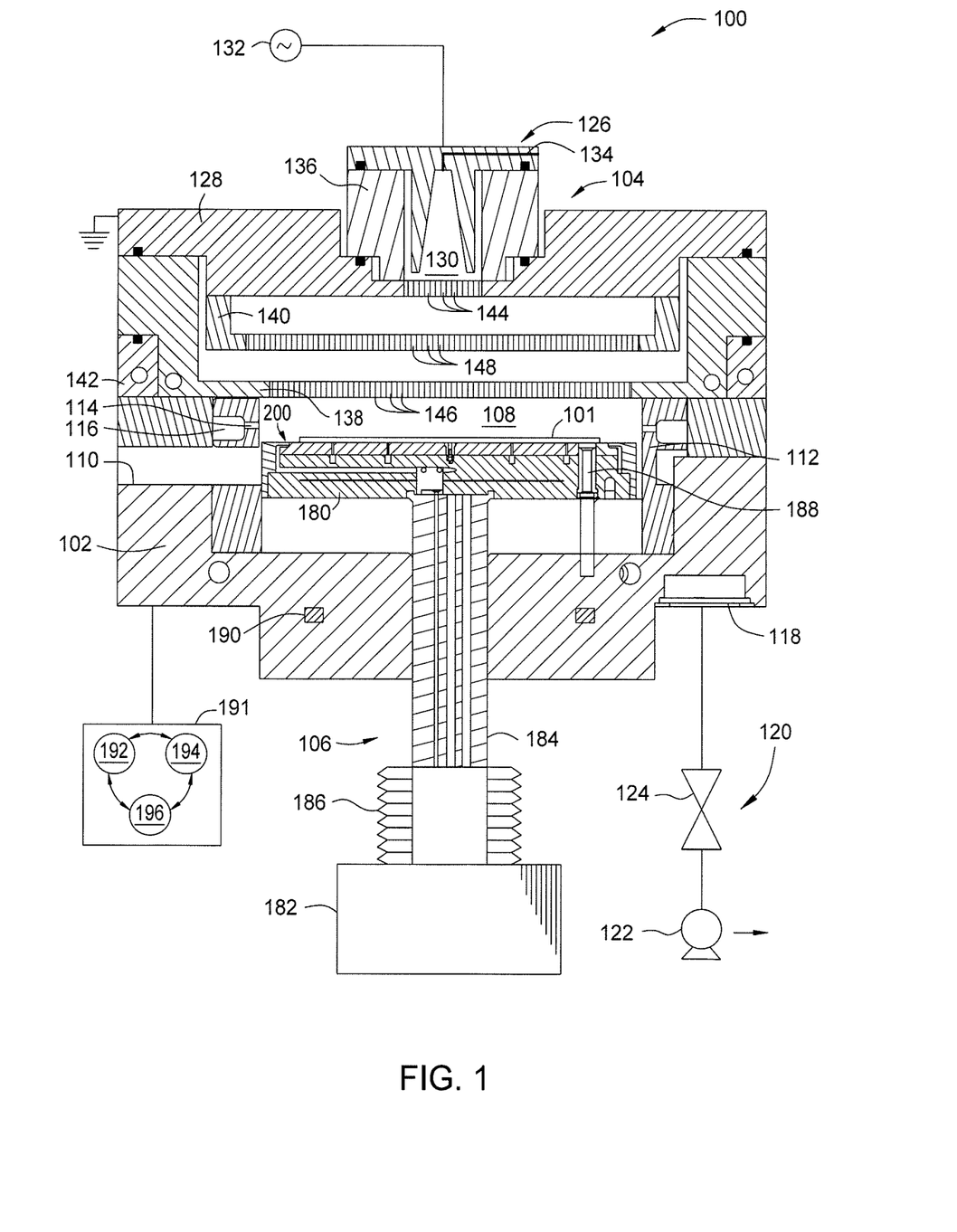
FIG. 1 is a cross sectional view of a processing chamber, according to one embodiment.

FIG. 1 is a cross sectional view of a processing chamber 100 having an adjustable tuning ring, such as an adjustable tuning ring 150 illustrated in FIGS. 2A, 2B, 3, 4A, and/or 4B, according to one embodiment. As shown, the processing chamber 100 is an etch chamber suitable for etching a substrate, such as substrate 101. Examples of processing chambers that may be adapted to benefit from the disclosure are Sym3® Processing Chamber, C3® Processing Chamber, and Mesa™ Processing Chamber, commercially available from Applied Materials, Inc., located in Santa Clara, Calif. It is contemplated that other processing chamber, including deposition chambers and those from other manufacturers, may be adapted to benefit from the disclosure.

The processing chamber 100 may be used for various plasma processes. In one embodiment, the processing chamber 100 may be used to perform dry etching with one or more etching agents. For example, the processing chamber may be used for ignition of plasma from a precursor $C_xF_y$ (where x and y can be different allowed combinations), O2, NF3, or combinations thereof.

The processing chamber 100 includes a chamber body 102, a lid assembly 104, and a support assembly 106. The lid assembly 104 is positioned at an upper end of the chamber body 102. The support assembly 106 is disclosed in an interior volume 108, defined by the chamber body 102. The chamber body 102 includes a slit valve opening 110 formed in a sidewall thereof. The slit valve opening 110 is selectively opened and closed to allow access to the interior volume 108 by a substrate handling robot (not shown).

The chamber body 102 may further include a liner 112 that surrounds the support assembly 106. The liner 112 is removable for servicing and cleaning. The liner 112 may be made of a metal such as aluminum, a ceramic material, or any other process compatible material. In one or more embodiments, the liner 112 includes one or more apertures 114 and a pumping channel 116 formed therein that is in fluid communication with a vacuum port 118. The apertures 114 provide a flow path for gases into the pumping channel 116. The pumping channel 116 provides an egress for the gases within the chamber 100 to vacuum port 118.

A vacuum system 120 is coupled to the vacuum port 118. The vacuum system 120 may include a vacuum pump 122 and a throttle valve 124. The throttle valve 124 regulates the flow of gases through the chamber 100. The vacuum pump 122 is coupled to the vacuum port 118 disposed in the interior volume 108.

The lid assembly 104 includes at least two stacked components configured to form a plasma volume or cavity therebetween. In one or more embodiments, the lid assembly 104 includes a first electrode 126 ("upper electrode") disposed vertically above a second electrode 128 ("lower electrode"). The upper electrode 126 and the lower electrode 128 confine a plasma cavity 130, therebetween. The first electrode 126 is coupled to a power source 132, such as an RF power supply. The second electrode 128 is connected to ground, forming a capacitance between the two electrodes 126, 128. The upper electrode 126 is in fluid communication with a gas inlet 134. The first end of the one or more gas inlets 134 opens into the plasma cavity 130.

The lid assembly 104 may also include an isolator ring 136 that electrically isolates the first electrode 126 from the second electrode 128. The isolator ring 136 may be made from aluminum oxide or any other insulative, processing compatible, material.

The lid assembly may also include a gas distribution plate 138 and a blocker plate 140. The second electrode 128, the gas distribution plate 138, and the blocker plate 140 may be stacked and disposed on a lid rim 142, which is coupled to the chamber body 102.

In one or more embodiments, the second electrode 128 may include a plurality of gas passages 144 formed beneath the plasma cavity 130 to allow gas from the plasma cavity 130 to flow therethrough. The gas distribution plate 138 includes a plurality of apertures 146 configured to distribute the flow of gases therethrough. The blocker plate 140 may optionally be disposed between the second electrode 128 and the gas distribution plate 138. The blocker plate 140 includes a plurality of apertures 148 to provide a plurality of gas passages from the second electrode 128 to the gas distribution plate 138.

The support assembly 106 may include a support member 180. The support member 180 is configured to support the substrate 101 for processing. The support member 180 may be coupled to a lift mechanism 182 through a shaft 184, which extends through a bottom surface of the chamber body 102. The lift mechanism 182 may be flexibly sealed to the chamber body 102 by a bellows 186 that prevents vacuum leakage from around the shaft 184. The lift mechanism 182 allows the support member 180 to be moved vertically within the chamber body 102 between a lower transfer portion and a number of raised process positions. Additionally, one or more lift pins 188 may be disposed through the support member 180. The one or more lift pins 188 are configured to extend through the support member 180 such that the substrate 101 may be raised off the surface of the support member 180. The one or more lift pins 188 may be activated by a lift ring 190.

Figure 2A:
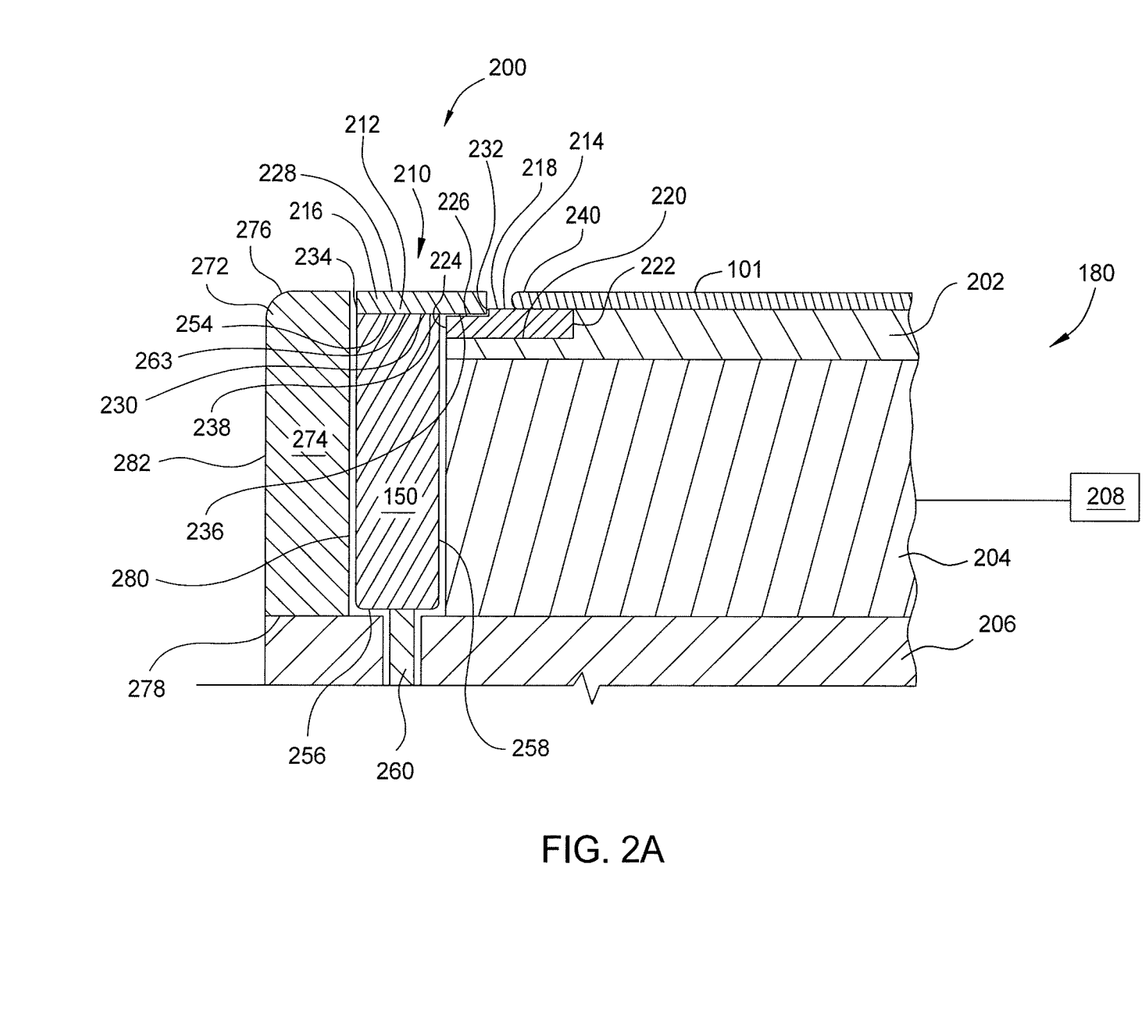
FIG. 2A is enlarged partial cross sectional view of the processing chamber of FIG. 1, according to one embodiment.

FIG. 2A is a partial cross sectional view of a portion of the processing chamber 100, illustrating a process kit 200 disposed therein on a support member 180, according to one embodiment. The support member 180 includes an electrostatic chuck 202, a cooling plate (or cathode) 204, and a base 206. The cooling plate 204 is disposed on the base 206. The cooling plate 204 may include a plurality of cooling channels (not shown) for circulating coolant therethrough. The cooling plate 204 may be engaged with the electrostatic chuck 202 by an adhesive or any suitable mechanism. One or more power supplies 208 may be coupled to the cooling plate 204. The electrostatic chuck 202 may include one or more heaters (not shown). The one or more heaters may be independently controllable. The one or more heaters enable the electrostatic chuck 202 to heat the substrate 101 from a bottom surface of the substrate 101 to a desired temperature.

The process kit 200 may be supported on the support member 180. The process kit 200 includes an edge ring 210 having an annular body 212. The annular body 212 is split into two edge ring components 214, 216. The two edge ring components 214, 216 are interfaced with each other such that component 216 may be movable relative to component 214. The first edge ring component 214 includes a top surface 218, a bottom surface 220, an inner edge 222, and an outer edge 224. The top surface 218 is substantially parallel to the bottom surface 220. The inner edge 222 is substantially parallel to the outer edge 224, and substantially perpendicular to the bottom surface 220. In some embodiments, the first edge ring component 214 further includes a stepped surface 226 defined therein. In the embodiment shown, the stepped surface 226 is formed in the outer edge 224, such that the stepped surface 226 is substantially parallel to the bottom surface 220. The stepped surface 226 defines a recess for receiving the second edge ring component 216. Generally, the height of the first edge ring component 214 is limited by the height of the electrostatic chuck 202. For example, the inner edge 222 of the first edge ring component 214 does not extend above the height of the electrostatic chuck 202. As such, the first edge ring component 214 protects a side of the electrostatic chuck 202. In some embodiments, the substrate 101, when positioned on the electrostatic chuck 202, extends partially over the first edge ring component 214.

The second edge ring component 216 includes a top surface 228, a bottom surface 230, an inner edge 232, and an outer edge 234. The top surface 228 is substantially parallel to the bottom surface 230. The inner edge 232 is substantially parallel to the outer edge 234 and substantially perpendicular to the bottom surface 230. In one embodiment, the second edge ring component 216 is interfaced with the first edge ring component 214 via the bottom surface 230. For example, the bottom surface 230 of the second edge ring component 216 interfaces with the stepped surface 226 in the first edge ring component 214. In another embodiment, the second edge ring component 216 may further include a stepped surface 236 defined therein. In the embodiment shown, the stepped surface 236 is formed in the inner edge 232, such that the stepped surface 236 interfaces with the stepped surface 226 of the first edge ring component 214. When interfaced with the first edge ring component 214, the inner edge 232 of the second edge ring component 216 is spaced from the substrate 101. For example, the inner edge 232 of the second edge ring component 216 may be spaced between about 0.02 mm and about 0.1 mm from the substrate 101.

In one embodiment, when interfaced, the first edge ring component 214 and the second edge ring component 216 forms a continuous bottom surface 238 and a continuous top surface 240. In another embodiment, when interfaced, the first edge ring component 214 and the second edge ring component 216 do not form a continuous bottom surface 238 or a continuous top surface 240. Rather, in some embodiments, the top surface 218 of the first edge ring component 214 may be higher than the top surface 228 of the second edge ring component 216. In other embodiments, the bottom surface 230 of the second edge ring component 216 may sit below the bottom surface 220 of the first edge ring component 214. Thus, in some embodiments, the first edge ring component 214 and the second edge ring component 216 do not form a continuous top or bottom surface.

The process kit further includes an adjustable tuning ring 150 having a top surface 254 and a bottom surface 256. The adjustable tuning ring 150 may be formed from a conductive material, such as aluminum. The adjustable tuning ring 150 is disposed beneath the edge ring 210. For example, the adjustable tuning ring 150 is disposed beneath the second edge ring component 216. The adjustable tuning ring 150 contacts the bottom surface of the 238 of the edge ring 210. For example, the adjustable tuning ring 150 contacts the bottom surface of the 230 of the second edge ring component 216. In one embodiment, the adjustable tuning ring 150 extends down the length of the electrostatic chuck 202 and the cooling plate 204, such that the adjustable tuning ring 150 has a height substantially equal to the combined height of the electrostatic chuck 202 and the cooling plate 204. As such, the adjustable tuning ring 150 is able to couple power from the cooling plate 204 to the edge ring 210.

The adjustable tuning ring 150 may circumscribe the cooling plate 204, thus forming a laterally spaced gap 258. In one example, the laterally spaced gap 258 is greater than 0 inches and less than or equal to 0.03 inches. The adjustable tuning ring 150 interfaces with a lift pin 260. For example, the lift pin 260 may be operably coupled with the adjustable tuning ring 150. The lift pin 260 is driven by the lift mechanism 182. In some embodiments, the lift pin 260 may be driven by a lift mechanism (not shown) independent from the lift mechanism 182. The lift mechanism 182 allows the adjustable tuning ring 150 to be moved vertically within the chamber 100. As a result of the vertical movement of the tuning ring 150, the lift mechanism 182 raises the second edge ring component 216. The second edge ring component 216 may be raised above the first edge ring component 214, thus forming a gap (299 in FIG. 4B) between the stepped surface of the first edge ring component and the stepped surface of the second edge ring component.

In one embodiment, the adjustable tuning ring 150 may include a coating 263 formed on the top surface 254 of the adjustable tuning ring 150. For example, the coating 263 may be a yttria oxide coating or a gel-like coating. The coating 263 is used to limit the chemical reaction between the plasma and the adjustable tuning ring 150 and thus limits particle creation and ring damage. In another embodiment, one or more dielectric pads (e.g., Teflon pads) 306 are positioned in between the edge ring 210 and the electrostatic chuck, on which the edge ring 210 sits.

Figure 2B:
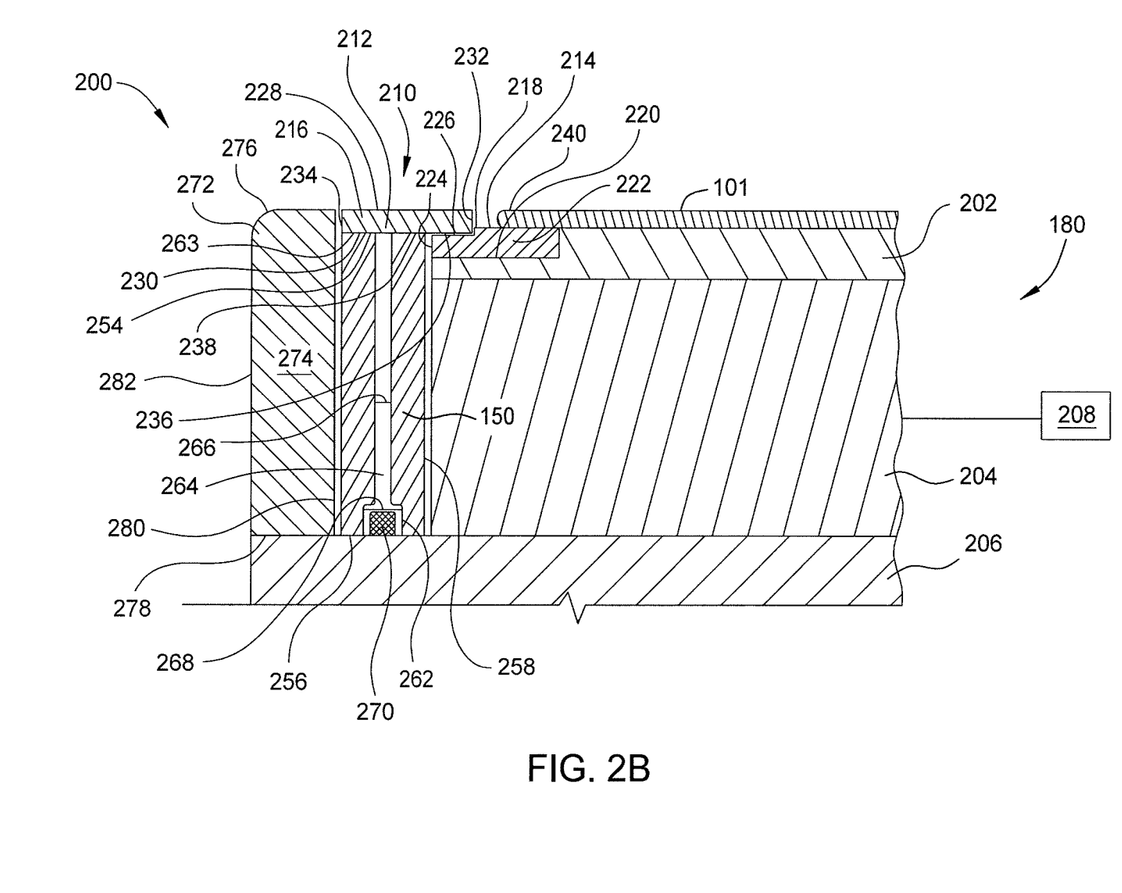
FIG. 2B is enlarged partial cross sectional view of the processing chamber of FIG. 1, according to one embodiment.

In another embodiment, such as that shown in FIG. 2B, the adjustable tuning ring 150 may be moved manually, thus eliminating the need for the lift pin 260. The tuning ring 150 may include a cavity 262 and an access orifice 264 formed therein. The access orifice 264 is formed from a top of the adjustable tuning ring 150, and extends down into the cavity 262. The access orifice 264 has a first diameter 266 that is smaller than a second diameter 268 of the cavity 262. The cavity 262 is formed beneath the access orifice 264. The cavity 262 is formed down to a bottom of the tuning ring 150. The cavity 262 is configured to house a screw 270. The screw 270 may be turned via a hex key (not shown), for example, extending into the cavity 262 via the access orifice 264 such that the screw 270 can raise/lower the tuning ring 150.

Discussing FIGS. 2A and 2B in conjunction, the process kit 200 may further include a quartz ring 272. The quartz ring 272 includes an annular shaped body 274 having a top surface 276, a bottom surface 278, an inner edge 280, and an outer edge 282. The top surface 276 is substantially parallel to the bottom surface 278. The inner edge 280 is substantially parallel to the outer edge 282, and substantially perpendicular to the bottom surface 278. The inner edge 280 is positioned adjacent the adjustable tuning ring 150 and the edge ring 210.

Figure 3:
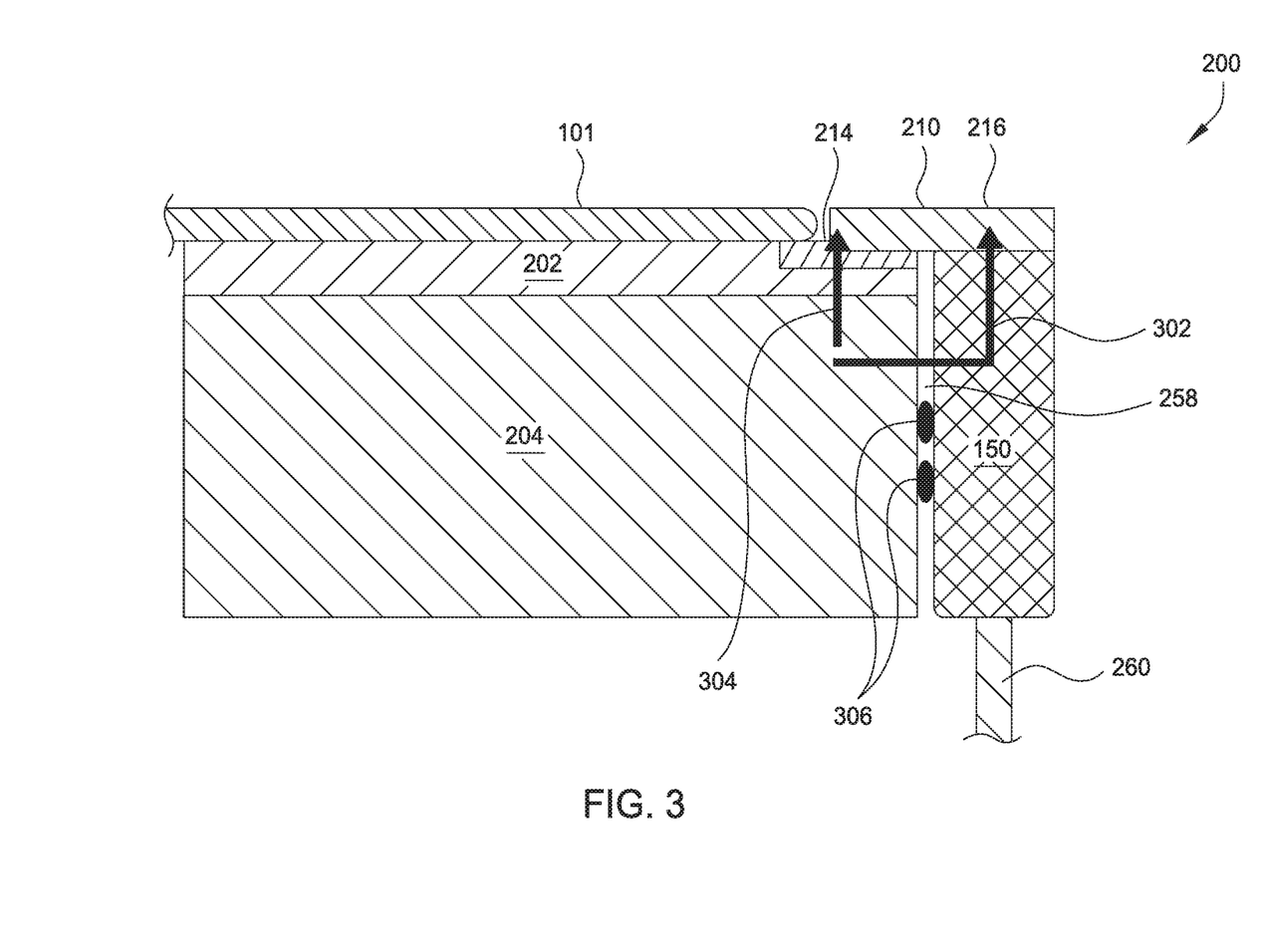
FIG. 3 is a simplified cross sectional view of a portion of the processing chamber of FIG. 1 depicting two capacitance paths, according to one embodiment.

FIG. 3 is a simplified cross sectional view of a portion of the processing chamber of FIG. 1 depicting two capacitances, according to one embodiment. Power may be coupled from the cathode 204 to the edge ring 210 along two paths through two capacitances 302, 304. The amount of power coupled depends on the capacitance along these two paths relative to the capacitance 305 between the ring 210 and the plasma. Depending on the plasma conditions, the capacitance 305 may vary. For example, the capacitance 305 may vary from 5 pF up to 150 pF. In another example, the capacitance 304 may vary between about 10 pF and about 500 pF due to the formation of a parallel plane capacitor between the two edge ring components 214, 216 as the adjustable tuning ring 150 is moved up and down. The capacitance 302 may also vary when the adjustable tuning ring 150 moves up and down because there is an area of overlap between the adjustable tuning ring 150 and the cathode 204. The positioning of the adjustable tuning ring 150 and the cathode 204 forms a parallel plate capacitor. As the adjustable tuning ring 150 moves up and down, the area of overlap between the adjustable tuning ring 150 and the cathode 204 varies, which results in a varying capacitance 302. Nevertheless the capacitance 302 variation is limited because the amplitude of the vertical movement is small relatively to the length of the adjustable tuning ring 150 overlapping with the cathode 204 For example, the amplitude of the vertical movement may be about 0 mm to about 2 mm, while the length of the adjustable tuning ring 150 that overlaps the cathode is about 3 cm. As a result, the capacitance 302 remains above some threshold amount. For example, the capacitance 302 may remain above 1000 pF. Therefore, the capacitance between the cathode 204 and the edge ring 210, which is the sum of the capacitances 302 and 304, is always at least on order of magnitude higher than the capacitance 305. As such, the potential, $V_{DC}$, of the edge ring 210 remains nearly constant. For example, the potential variation may not exceed 5%. Maintaining the voltage, $V_{DC}$, applied to the edge ring 210 as constant allows for control of a plasma sheath about the substrate 101 and the edge ring 210. The effect of which, is discussed in more detail below in conjunction with FIGS. 4A and 4B.

Figure 4A:
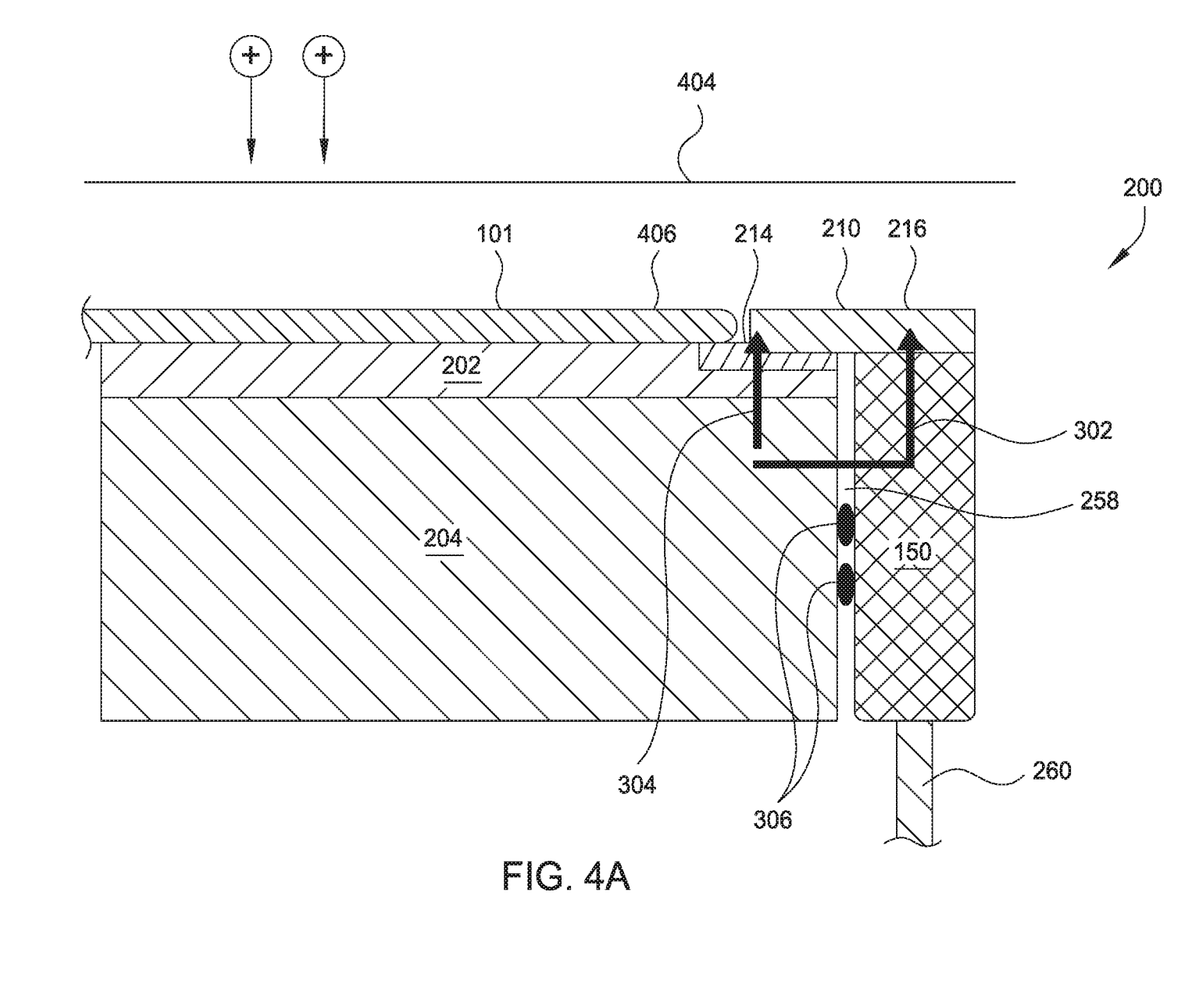
FIG. 4A is a simplified cross sectional view of a portion of the processing chamber of FIG. 1, according to one embodiment, illustrating another advantage of the present disclosure.

FIG. 4A illustrates a portion of the processing chamber 100, according to one embodiment, illustrating another advantage of the present disclosure. The voltage, $V_{DC}$, can be used to control plasma sheath 404 profile at an edge 406 of the substrate 101 to compensate for critical dimension uniformity at the substrate edge 406. The plasma sheath 404 is a thin region of strong electric fields formed by space charge that joins the body of the plasma to its material boundary. Mathematically, the sheath thickness, d, is represented by the Child-Langmuir equation:

$$d = \frac{2}{3}\left(\frac{\varepsilon}{i}\right)^{\frac{1}{2}}\left(\frac{2e}{m}\right)^{\frac{1}{4}}(V_p - V_{DC})^{\frac{3}{4}}$$

Where i is the ion current density, ε is the permittivity of vacuum, e is the elementary electric charge, $V_p$ is the plasma potential, and $V_{DC}$ is the DC voltage.

Figure 4B:
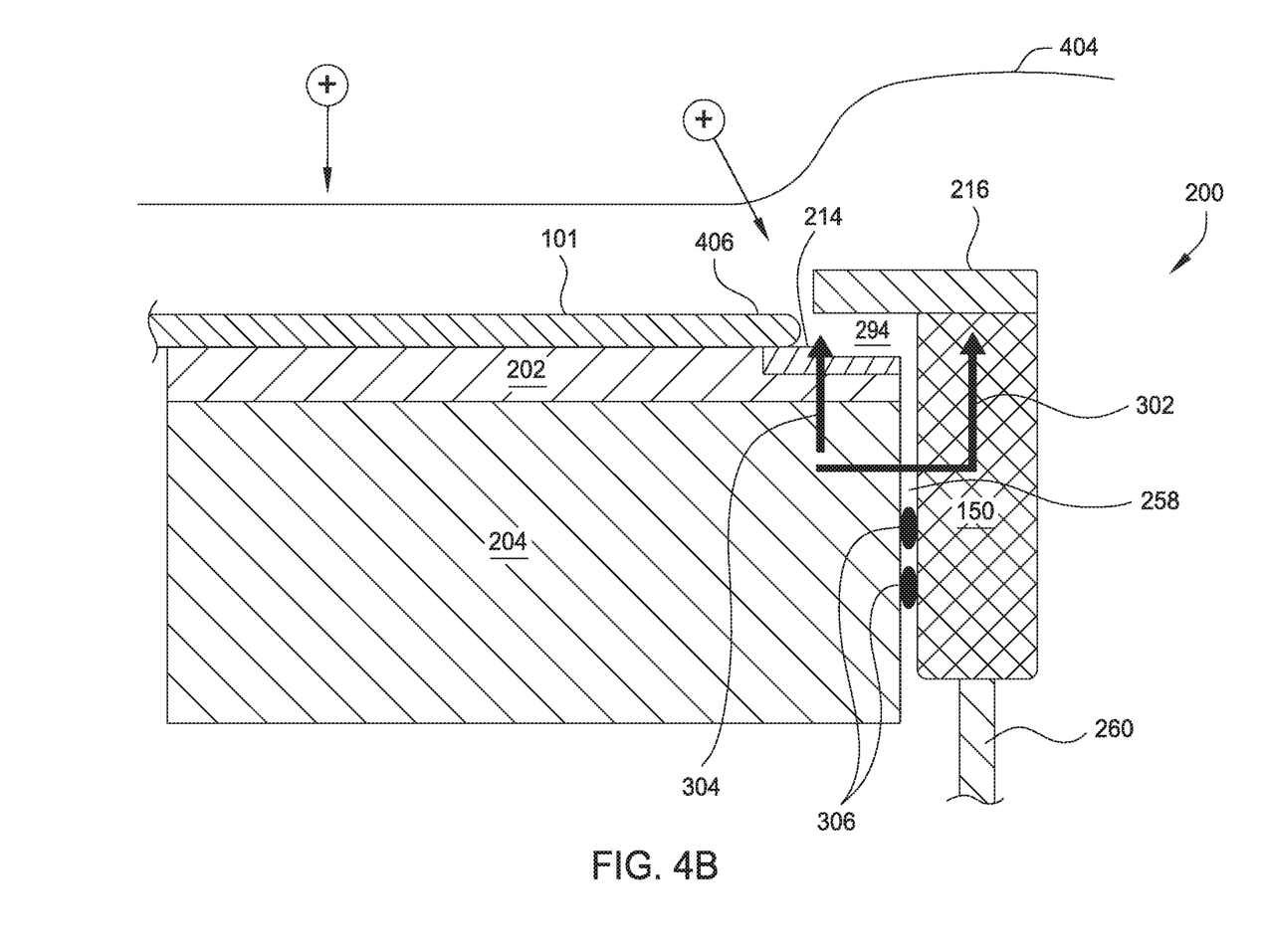
FIG. 4B is a simplified cross sectional view of a portion of the processing chamber of FIG. 1, according to one embodiment, illustrating another advantage of the present disclosure.

In the case of an etch reactor, a plasma sheath 404 is formed between the plasma and the substrate 101 being etched, the chamber body 102, and every other part of the processing chamber 100 in contact with the plasma. The ions produced in a plasma are accelerated in the plasma sheath and move perpendicular to the plasma sheath. Controlling the $V_{DC}$, i.e., controlling the voltage applied to the edge ring 210, affects the thickness, d, of the sheath 404. The sheath thickness, d, of sheath 404 may be measured with respect to the edge ring 210. For example, the thickness, d, is depicted in FIGS. 4A and 4B. In the embodiment shown, actuating the adjustable tuning ring 150 raises second edge ring component 216. Because $V_{DC}$ remains constant, the sheath thickness above the edge ring 210 remains constant. Therefore actuating the adjustable tuning ring 150 vertically raises the sheath 404 without impacting the sheath thickness. Thus, moving the adjustable tuning ring 150 affects the shape of the sheath 404 at the substrate 101 edge 406, which in turn controls the direction of plasma ions.

FIG. 4B illustrates the portion of the processing chamber 100 of FIG. 4A, with the second edge ring component 216 in the raised position. As illustrated, and as discussed in FIG. 4A, raising the adjustable tuning ring 150 raises the second edge ring component 216, which in turn raises the sheath 404. Because the potential, $V_{DC}$, remains nearly constant as a result of a nearly fixed capacitance 302, the sheath 404 thickness, d, remains constant throughout.

Referring back to FIG. 1, control of the adjustable tuning ring may be controlled by a controller 191. The controller 191 includes programmable central processing unit (CPU) 192 that is operable with a memory 194 and a mass storage device, an input control unit, and a display unit (not shown), such as power supplies, clocks, cache, input/output (I/O) circuits, and the liner, coupled to the various components of the processing system to facilitate control of the substrate processing.

To facilitate control of the chamber 100 described above, the CPU 192 may be one of any form of general purpose computer processor that can be used in an industrial setting, such as a programmable logic controller (PLC), for controlling various chambers and sub-processors. The memory 194 is coupled to the CPU 192 and the memory 194 is non-transitory and may be one or more of readily available memory such as random access memory (RAM), read only memory (ROM), floppy disk drive, hard disk, or any other form of digital storage, local or remote. Support circuits 196 are coupled to the CPU 192 for supporting the processor in a conventional manner. Charged species generation, heating, and other processes are generally stored in the memory 194, typically as software routine. The software routine may also be stored and/or executed by a second CPU (not shown) that is remotely located from the processing chamber 100 being controlled by the CPU 192.

The memory 194 is in the form of computer-readable storage media that contains instructions, that when executed by the CPU 192, facilitates the operation of the chamber 100. The instructions in the memory 194 are in the form of a program product such as a program that implements the method of the present disclosure. The program code may conform to any one of a number of different programming languages. In one example, the disclosure may be implemented as a program product stored on a computer-readable storage media for use with a computer system. The program(s) of the program product define functions of the embodiments (including the methods described herein). Illustrative computer-readable storage media include, but are not limited to: (i) non-writable storage media (e.g., read-only memory devices within a computer such as CD-ROM disks readable by a CD-ROM drive, flash memory, ROM chips, or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure.

While the foregoing is directed to specific embodiments, other and further embodiments may be devised without departing from the basic scope thereof, and the scope thereof is determined by the claims that follow.

What is claimed is:

1. A process kit for a substrate processing chamber, the process kit comprising:
    a ring having a first ring component and a second ring component, the first ring component interfaced with the second ring component such that the second ring component is movable relative to the first ring component forming a gap therebetween;
    an adjustable tuning ring positioned beneath the ring and contacting a bottom surface of the second ring component, the adjustable tuning ring having an annular body having a top surface and a bottom surface, a cavity formed in the bottom surface of the annular body, and an access orifice formed in the annular body, the access orifice extending from the top surface of the annular body into the cavity, the top surface of the annular body contacting the second ring component; and
    an actuating mechanism interfaced with the bottom surface of the annular body of the adjustable tuning ring, the actuating mechanism being configured to actuate the adjustable tuning ring such that the gap between the first ring component and the second ring component is varied.

2. The process kit of claim 1, wherein the adjustable tuning ring is formed from a conductive material.

3. The process kit of claim 1, wherein the first ring component comprises:
a stepped surface formed therein.

4. The process kit of claim 3, wherein the second ring component comprises:
a stepped surface formed therein, wherein the stepped surface of the second ring component interfaces with the stepped surface of the first ring component.

5. The process kit of claim 1, wherein the actuating mechanism comprises:
a lift pin having a first end and a second end, the first end of the lift pin contacting the bottom surface of the annular body of the adjustable tuning ring, the second end of the lift pin in communication with a lift mechanism.

6. The process kit of claim 1, wherein the actuating mechanism is a screw disposed at least partially in the cavity, the screw configured to be rotated through the access orifice to actuate the adjustable tuning ring.

7. The process kit of claim 1, wherein the cavity has a first diameter and the access orifice has a second diameter, the first diameter being larger than the second diameter.

8. A process kit for a substrate processing chamber, the process kit comprising:
a ring having a first ring component and a second ring component, the first ring component interfaced with the second ring component such that the second ring component is movable relative to the first ring component forming a gap therebetween;
an adjustable tuning ring positioned beneath the ring and contacting a bottom surface of the second ring component, the adjustable tuning ring having a top surface and a bottom surface, the top surface of the adjustable tuning ring contacting the second ring component; and
an actuating mechanism interfaced with the bottom surface of the adjustable tuning ring, the actuating mechanism being configured to actuate the adjustable tuning ring such that the gap between the first ring component and the second ring component is varied, and the actuating mechanism being configured to push up and down a plasma sheath formed between a plasma and the ring while maintaining a plasma sheath thickness nearly constant.

9. The process kit of claim 8, wherein the first ring component comprises a stepped surface formed therein, the second ring component comprises a stepped surface formed therein, and the stepped surface of the second ring component interfaces with the stepped surface of the first ring component.

10. The process kit of claim 8, wherein the actuating mechanism comprises:
a lift pin having a first end and a second end, the first end of the lift pin contacting the bottom surface of the adjustable tuning ring, the second end of the lift pin in communication with a lift mechanism.

11. A processing chamber, comprising:
a substrate support member configured to support a substrate; and
a process kit supported by the substrate support member, the process kit comprising:
a ring having a first ring component and a second ring component, the first ring component interfaced with the second ring component such that the second ring component is movable relative to the first ring component forming a gap therebetween;
an adjustable tuning ring positioned beneath the ring and contacting a bottom surface of the second ring component, the adjustable tuning ring having an annular body having a top surface and a bottom surface, a cavity formed in the bottom surface of the annular body, and an access orifice formed in the annular body, the access orifice extending from the top surface of the annular body into the cavity, the top surface of the annular body contacting the second ring component; and
an actuating mechanism interfaced with the bottom surface of the annular body of the adjustable tuning ring, the actuating mechanism being configured to actuate the adjustable tuning ring such that the gap between the first ring component and the second ring component is varied.

12. The processing chamber of claim 11, wherein the adjustable tuning ring is formed from a conductive material.

13. The processing chamber of claim 11, wherein the first ring component comprises:
a stepped surface formed therein.

14. The processing chamber of claim 13, wherein the second ring component comprises:
a stepped surface formed therein, wherein the stepped surface of the second ring component interfaces with the stepped surface of the first ring component.

15. The processing chamber of claim 11, wherein the actuating mechanism comprises:
a lift pin having a first end and a second end, the first end of the lift pin contacting the bottom surface of the annular body of the adjustable tuning ring, the second end of the lift pin in communication with a lift mechanism.

16. The processing chamber of claim 11, wherein the actuating mechanism is a screw disposed at least partially in the cavity, the screw configured to be rotated through the access orifice to actuate the adjustable tuning ring.

17. The processing chamber of claim 11, wherein the cavity has a first diameter and the access orifice has a second diameter, the first diameter being larger than the second diameter.

18. A processing chamber, comprising:
a substrate support member configured to support a substrate; and
a process kit supported by the substrate support member, the process kit comprising:
a ring having a first ring component and a second ring component, the first ring component interfaced with the second ring component such that the second ring component is movable relative to the first ring component forming a gap therebetween;
an adjustable tuning ring positioned beneath the ring and contacting a bottom surface of the second ring component, the adjustable tuning ring having a top surface and a bottom surface, the top surface of the adjustable tuning ring contacting the second ring component; and
an actuating mechanism interfaced with the bottom surface of the adjustable tuning ring, the actuating mechanism being configured to actuate the adjustable tuning ring such that the gap between the first ring component and the second ring component is varied, and the actuating mechanism being configured to push up and down a plasma sheath formed between a plasma and the ring while maintaining a plasma sheath thickness nearly constant.

19. The processing chamber of claim 11, wherein the substrate support member comprises:
   a base;
   a cooling plate supported by the base; and
   an electrostatic chuck positioned on a top surface of the cooling plate.

20. The processing chamber of claim 18, wherein the first ring component comprises a stepped surface formed therein, the second ring component comprises a stepped surface formed therein, and the stepped surface of the second ring component interfaces with the stepped surface of the first ring component.

* * * * *